United States Patent [19]

Cheng et al.

[11] Patent Number: 5,345,366
[45] Date of Patent: Sep. 6, 1994

[54] SUBSTRATE TO SUBSTRATE STANDOFF ASSEMBLY

[75] Inventors: Chee F. Cheng; Chiou C. You; Kai L. Tong, all of Singapore, Singapore

[73] Assignee: Motorola, Inc., Schaumburg, Ill.

[21] Appl. No.: 64,479

[22] Filed: May 21, 1993

[51] Int. Cl.5 .......................................... H01R 23/68
[52] U.S. Cl. .................................... 361/785; 361/784; 361/825; 174/138 G; 174/166 S; 439/55
[58] Field of Search ............... 361/715, 744, 784, 785, 361/807, 825; 174/138 G, 166 S; 439/45, 55, 74, 75

[56] References Cited

U.S. PATENT DOCUMENTS 3,596,138  7/1971  Lehrfeld .
5,172,303  12/1992  Bernardoni et al. ............... 361/396

Primary Examiner—Leo P. Picard
Assistant Examiner—Young Whang
Attorney, Agent, or Firm—Pablo Meles

[57] ABSTRACT

A substrate to substrate interconnect and standoff assembly (10) comprises an electronic coupling (39) between the bottom of a first substrate (14) and the bottom of a second substrate (12), an electronic coupling (24) of the top of the first substrate to the bottom of the second substrate, a stand-off (20) between the first substrate and the second substrate, and a mechanical coupling (16) between the first substrate to the second substrate.

20 Claims, 2 Drawing Sheets

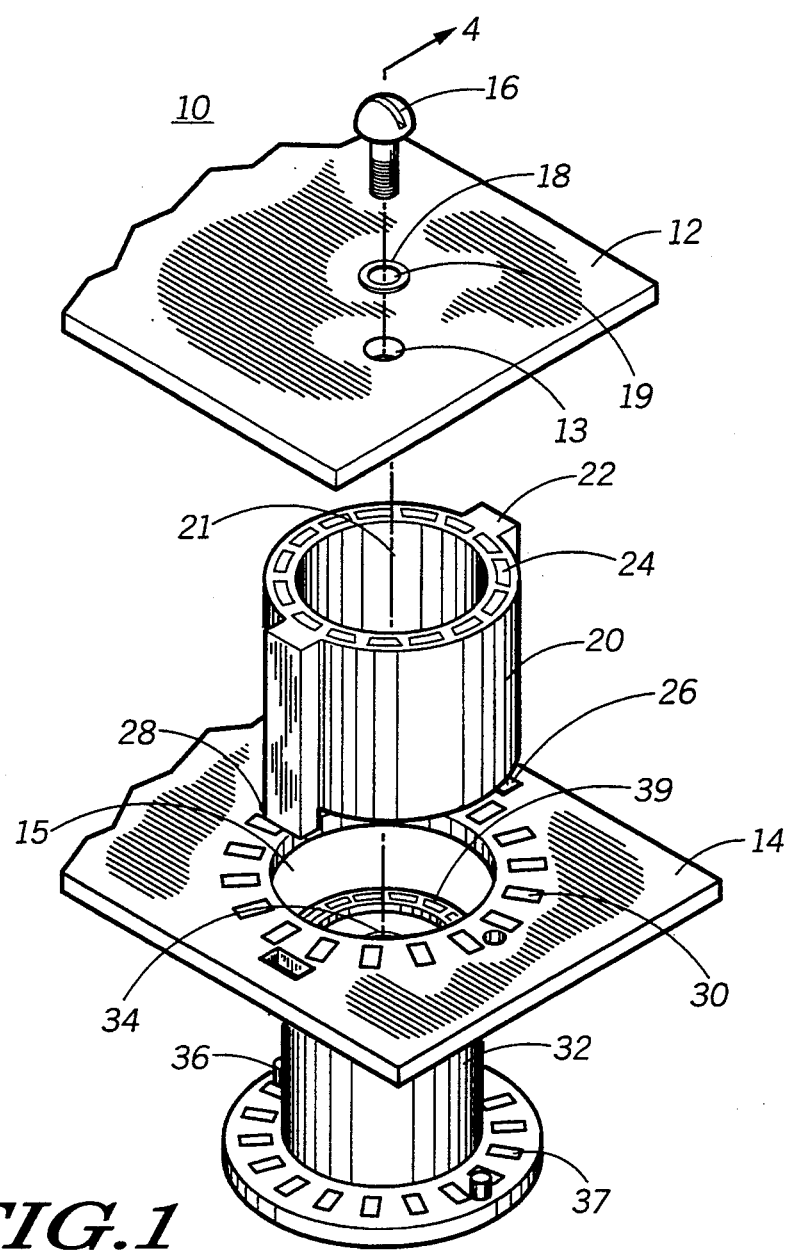
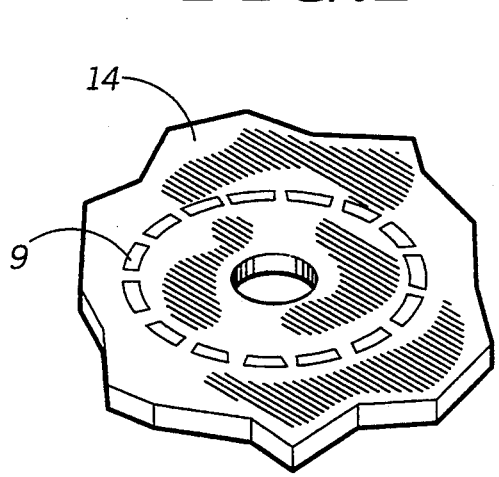
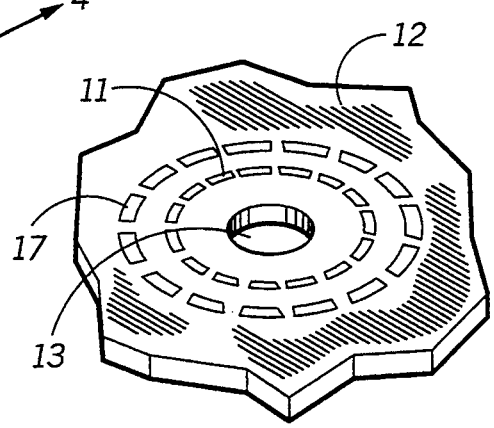
FIG.1
FIG.3　　FIG.2

SUBSTRATE TO SUBSTRATE STANDOFF ASSEMBLY

TECHNICAL FIELD

This invention relates generally to substrate board assemblies in electronic products and in particular, to a substrate to substrate standoff that electronically couples at least two substrates.

BACKGROUND

Board to board interconnections requiring standoffs typically use more parts and labor than required and have poor mechanical and electrical characteristics due to misalignment of parts. Moreover, additional parts are typically used to connect conductive runners on the bottom of a first substrate to the bottom of a second substrate when standoffs are used. Thus, a need exists for reducing the labor intensive procedures of existing board to board interconnecting standoff assemblies and improving the mechanical and electrical characteristics of these assemblies.

SUMMARY OF THE INVENTION

A substrate to substrate interconnect and standoff assembly comprises an electronic coupling between the bottom of a first substrate and the bottom of a second substrate, an electronic coupling of the top of the first substrate to the bottom of the second substrate, a standoff between the first substrate and the second substrate, and a mechanical coupling between the first substrate to the second substrate.

BRIEF DESCRIPTION OF THE DRAWINGS

FIG. 1 is an exploded perspective view of a substrate to substrate interconnect standoff assembly in accordance with the present invention.

FIG. 2 is a perspective view of a bottom surface of a second substrate shown in FIG. 1 in accordance with the present invention.

FIG. 3 is a perspective view of a bottom surface of a first substrate shown in FIG. 1 in accordance with the present invention.

DETAILED DESCRIPTION OF THE PREFERRED EMBODIMENT

Figure 4:
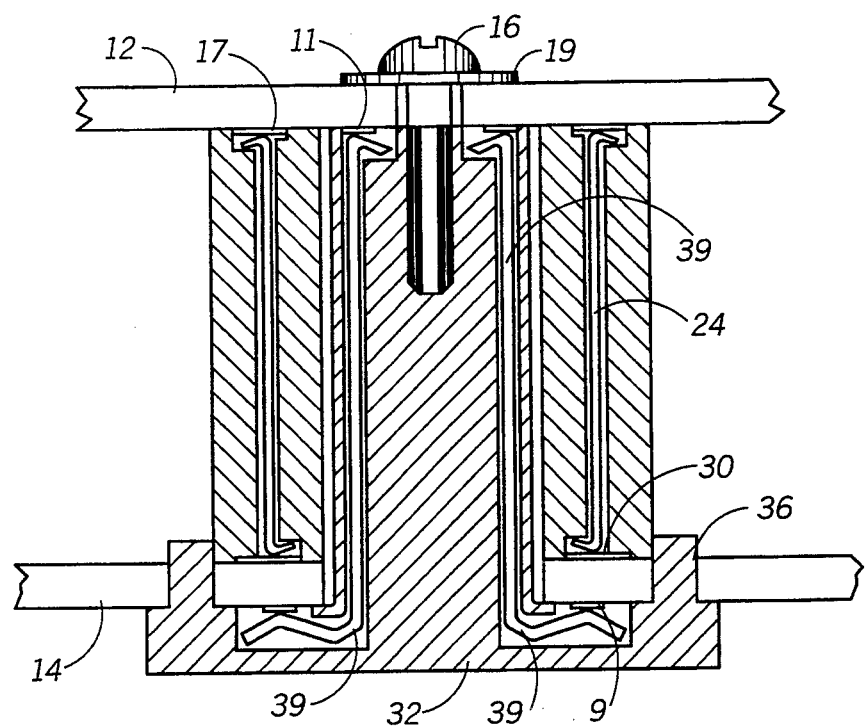
FIG. 4 is a cross-sectional view along line 4—4 in FIG. 1 of the substrate to substrate interconnect stand-off in accordance with the present invention.

Referring to FIG. 1, there is shown an exploded perspective view of a substrate to substrate interconnect stand-off assembly 10 in accordance with the present invention. The assembly 10 preferably comprises first and second substrates (14 & 12 respectively) preferably having conductors on opposing sides of the respective substrates. The substrates 14 and 12 are separated by a means for standing-off the first substrate from the second substrate or otherwise by a stand-off consisting of a sleeve 20 and a core 32 that is inserted into both an opening 34 in substrate 14 and an opening 21 within the sleeve 20. Referring to FIGS. 1 through 4, the core 32 provides a means for electronically coupling the bottom of the first substrate 14 to the bottom of the second substrate 12 in the form of substantially vertical conductors 39 that are arranged and constructed to be within the periphery of the wall of the core. The conductors 39 are preferably wires or metal strips that couple the conductive pads 9 on the bottom of the first substrate 14 to the conductive pads 11 on the bottom of the second substrate 12. The substantially vertical conductors shown in FIGS. 1 and 4 are preferably substantially "L" shaped to provide the appropriate connections. The sleeve 20, provides a means for electronically coupling a conductive pad 30 on top of the first substrate 14 to a conductive pad 17 on the second substrate 12. As in the core, the sleeve 20 preferably has vertical conductors 24 within the periphery of the wall of the sleeve 20. Additionally, the means for standing off or the means for electronically coupling the top of a first substrate to the bottom of a second substrate or the sleeve 20 is preferably a substantially cylindrically shaped as shown in FIG. 1. Preferably, the sleeve 20 is made of compressible rubber and the vertical conductors within the sleeve are wires. Alternatively, the sleeve 20 can be made of plastic and the vertical conductors can be metal strips. Finally, the assembly 10 includes a means for retaining the first substrate 14 to the second substrate 12. Such means for retaining can include screw 16 inserted within an opening 13 in the first substrate 14 and inserted in preferably a tapped hole 34 in the core 32. Additionally, a washer 18 having a hole 18 may be used between the screw and the first substrate. Alternatively, an adhesive can be used on the mating surfaces between the sleeve and the substrates to retain the substrates together.

To provide alignment during the manufacture of assembly 10, several features are preferably implemented as shown in FIG. 1. For example, the protruding keys 22 preferably formed on the external opposing sides of sleeve 20 allows for the alignment or registration of the sleeve 20 with the first substrate. 14 by inserting the keys 22 into the mating openings 26. Likewise, the core 32 has protruding locating pins that allows the core to align with the first substrate 14 by inserting the pins into the mating openings 28.

Figure 5:
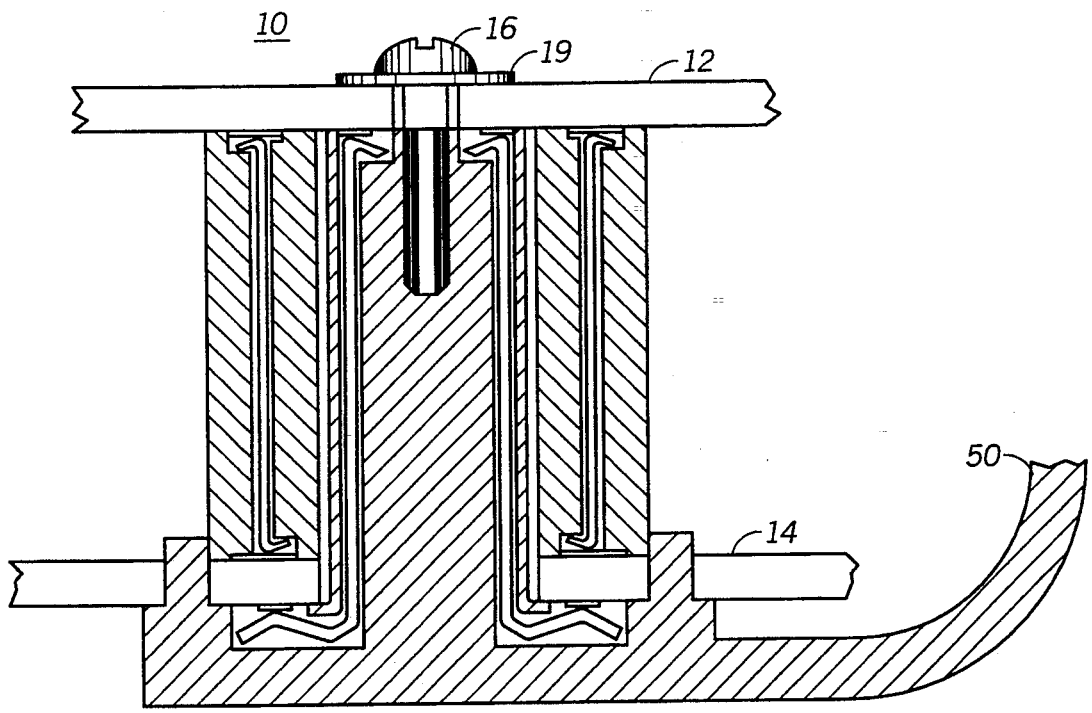
FIG. 5 is a cross-section view of an alternative embodiment in accordance with the present invention.

In alternative embodiment of the present invention shown in FIG. 5, the assembly 10 uses a portion of a housing 50 to form the alternate core 52 which is an integral portion of a boss formed in the housing 50. As in the embodiment of FIG. 1–4, this assembly 10 similarly comprises a first and second substrate (14 and 12 respectively) having a standoff or a substantially cylindrical shaped sleeve 20 having vertical conductors 24 within the walls of the periphery of the sleeve 20. Again, the assembly can include means for retaining such as a screw 16 which is inserted through an opening 13 in the first substrate 14 and through a hole in the upper portion of the boss 52. Preferably, a washer 19 is placed between the .screw 16 and the first substrate 14 and the hole in the boss 52 is threaded. Again, in the alternative, adhesive on the mating surfaces between the sleeve 20 and the substrates can be used to retain the first substrate 14 to the second substrate 12.

What is claimed is:

1. A substrate to substrate interconnect and standoff assembly, comprising:
   means for electronically coupling a bottom of a first substrate to the bottom of a second substrate;
   means for electronically coupling a top of the first substrate to the bottom of the second substrate;
   means for standing-off the first substrate from the second substrate; and means for retaining the first substrate to the second substrate.

2. The substrate to substrate interconnect and standoff assembly of claim 1, wherein the means for standing-off comprises a substantially cylindrical shaped sleeve having vertical conductors.

3. The substrate to substrate interconnect and standoff assembly of claim 2, wherein the cylindrical shaped sleeve is made of compressible rubber and the vertical conductors are wires.

4. The substrate to substrate interconnect and standoff assembly of claim 2, wherein the cylindrical shaped sleeve is made of plastic and the vertical conductors are metal strips.

5. The substrate to substrate interconnect and standoff assembly of claim 1, wherein the means for electronically coupling the top of a first substrate to the bottom of a second substrate comprises a substantially cylindrical shaped sleeve having vertical conductors within the sleeve.

6. The substrate to substrate interconnect and standoff assembly of claim 1, wherein the means for electronically coupling the bottom of the first substrate to the bottom of the second substrate comprises a core for insertion through a hole in the first substrate and through a substantially cylindrical shaped sleeve, the core having substantially "L" shaped conductors within the core.

7. The substrate to substrate interconnect and standoff assembly of claim 6, wherein the core is an integral portion of a boss in a housing.

8. The substrate to substrate interconnect and standoff assembly of claim 1, wherein the means for retaining the first substrate to the second substrate comprises a screw inserted within a opening in the top substrate and a hole in the means for electronically coupling the top of the first substrate to the bottom of the second substrate.

9. The substrate to substrate interconnect and standoff assembly of claim 1, wherein the means for retaining the first substrate to the second substrate comprises adhesive.

10. A substrate to substrate interconnect and standoff assembly, comprising:
a sleeve having a plurality of conductors within a periphery of a wall of the sleeve, the conductors arranged and constructed to vertically run from a top portion to a bottom portion of the sleeve, the sleeve allowing the electronic coupling of the top portion of a first substrate to the bottom portion of a second substrate;
a core for insertion in an opening in the first substrate and for insertion in the sleeve; and
means for retaining the first substrate to the second substrate.

11. The substrate to substrate interconnect and standoff assembly of claim 10, wherein the core is an integral portion of a boss in a housing.

12. The substrate to substrate interconnect and standoff assembly of claim 10, wherein the core is arranged and constructed to have conductors within the core allowing for the electrical interconnection of the bottom of the first substrate to the bottom of the second substrate.

13. The substrate to substrate interconnect and standoff assembly of claim 10, wherein the means for retaining the first substrate to the second substrate comprises a screw inserted within a opening in the top substrate and a hole in the core.

14. The substrate to substrate interconnect and standoff assembly of claim 10, wherein the means for retaining the first substrate to the second substrate comprises adhesive.

15. A substrate to substrate standoff assembly, comprising:
a first substrate having conductors on a top portion and a bottom portion;
a second substrate having conductors on at least a bottom portion;
means for electronically coupling the bottom of the first substrate to the bottom of the second substrate;
means for electronically coupling the top of the first substrate to the bottom of the second substrate;
means for standing-off the first substrate from the second substrate; and
means for retaining the first substrate to the second substrate.

16. The substrate to substrate interconnect and standoff assembly of claim 15, wherein the means for standing-off comprises a substantially cylindrical shaped sleeve having vertical conductors.

17. The substrate to substrate interconnect and standoff assembly of claim 15, wherein the means for electronically coupling the bottom of the first substrate to the bottom of the second substrate comprises a core for insertion through a hole in the first substrate and through a substantially cylindrical shaped sleeve, the core having substantially "L" shaped conductors within the core.

18. The substrate to substrate interconnect and standoff assembly of claim 17, wherein the core is an integral portion of a boss in a housing.

19. The substrate to substrate interconnect and standoff assembly of claim 15, wherein the means for retaining the first substrate to the second substrate comprises a screw inserted within a opening in the top substrate and a hole in the means for electronically coupling the top of the first substrate to the bottom of the second substrate.

20. The substrate to substrate interconnect and standoff assembly of claim 15, wherein the means for retaining the first substrate to the second substrate comprises adhesive.

* * * * *